US012107032B2

(12) United States Patent
Tschida et al.

(10) Patent No.: US 12,107,032 B2
(45) Date of Patent: Oct. 1, 2024

(54) COOLING OF POWER SEMICONDUCTORS

(71) Applicant: ABB Schweiz AG, Baden (CH)

(72) Inventors: Colin Tschida, Durham, NC (US); Pietro Cairoli, Raleigh, NC (US); Hongrae Kim, Cary, NC (US); Francesco Agostini, Zurich (CH); Luca Raciti, Bergamo (IT); Davide Leoni, Trescore Balneario (IT)

(73) Assignee: ABB SCHWEIZ AG, Baden (CH)

( * ) Notice: Subject to any disclaimer, the term of this patent is extended or adjusted under 35 U.S.C. 154(b) by 1017 days.

(21) Appl. No.: 16/717,493

(22) Filed: Dec. 17, 2019

(65) Prior Publication Data

US 2020/0203255 A1 Jun. 25, 2020

Related U.S. Application Data (60) Provisional application No. 62/781,861, filed on Dec. 19, 2018.

(51) Int. Cl.
*H01L 23/427* (2006.01)
*H01C 1/082* (2006.01)
*H01C 7/12* (2006.01)
*H01L 23/495* (2006.01)
(Continued)

(52) U.S. Cl.
CPC ........... *H01L 23/427* (2013.01); *H01C 1/082* (2013.01); *H01C 7/12* (2013.01); *H01L 23/49562* (2013.01); *H02H 9/044* (2013.01); *H05K 7/20172* (2013.01); *H05K 7/20309* (2013.01); *H05K 7/20318* (2013.01); *H05K 7/20327* (2013.01); *H05K 7/20336* (2013.01);
(Continued)

(58) Field of Classification Search
CPC . H01L 23/427; H01L 23/49562; H01C 1/082; H01C 7/12; H02H 9/044; H05K 7/20172; H05K 7/20309; H05K 7/20318; H05K 7/20327; H05K 7/20336; H05K 7/209; H05K 7/20909; H05K 7/20936
See application file for complete search history.

(56) References Cited

U.S. PATENT DOCUMENTS

| 6,008,975 | A | 12/1999 | Kester et al. |
| 6,087,800 | A * | 7/2000 | Becker ..................... H02P 1/16 318/370 |
| 6,215,681 | B1 | 4/2001 | Schuurman et al. |

(Continued)

FOREIGN PATENT DOCUMENTS

| CN | 1267124 A | 9/2000 |
| CN | 102034774 A | 4/2011 |

(Continued)

OTHER PUBLICATIONS

Extended European Search Report, issued by the European Patent Office, regarding corresponding patent application Serial No. EP 19898070.8; dated Sep. 14, 2022; 11 pages.

*Primary Examiner* — Gordon A Jones
(74) *Attorney, Agent, or Firm* — Greenberg Traurig, LLP (57) ABSTRACT

Cooling arrangements are disclosed for solid state circuit breakers. In one arrangement, a MOV is disposed between two pulsating heat pipes. An IGCT is disposed on the other side of each pulsating heat pipe away from the MOV. In another arrangement, a bus bar is integral with a heat spreader disposed between a pulsating heat pipe and an IGCT.

17 Claims, 11 Drawing Sheets

(51) Int. Cl.
*H02H 9/04* (2006.01)
*H05K 7/20* (2006.01)

(52) U.S. Cl.
CPC ......... *H05K 7/209* (2013.01); *H05K 7/20909* (2013.01); *H05K 7/20936* (2013.01)

(56) References Cited

U.S. PATENT DOCUMENTS

| | | |
|---|---|---|
| 6,448,676 B1 | 9/2002 | Kershaw |
| 8,717,746 B2 | 5/2014 | Kaufmann et al. |
| 9,392,729 B2 * | 7/2016 | Tuomola ............ H05K 7/20936 |
| 2001/0033477 A1 | 10/2001 | Inoue et al. |
| 2002/0180037 A1 | 12/2002 | Shirakawa et al. |
| 2006/0203409 A1 | 9/2006 | Grisoni |
| 2008/0049476 A1 | 2/2008 | Azuma et al. |
| 2009/0056916 A1 * | 3/2009 | Yesin ................ F28F 1/126 29/890.038 |
| 2011/0080711 A1 | 4/2011 | Yesin et al. |
| 2012/0218684 A1 | 8/2012 | Andersen et al. |
| 2012/0228757 A1 * | 9/2012 | Kitami ................ H01L 23/36 257/713 |
| 2012/0299375 A1 | 11/2012 | Saez-Zamora et al. |
| 2013/0104592 A1 * | 5/2013 | Cottet ................ H05K 7/14325 62/407 |
| 2013/0250490 A1 | 9/2013 | Kaufmann et al. |
| 2014/0104790 A1 | 4/2014 | Yoon et al. |
| 2015/0173242 A1 * | 6/2015 | Blomberg ............ F28D 15/0241 62/259.2 |
| 2015/0250074 A1 * | 9/2015 | Matsumoto ........ H05K 7/20336 165/104.21 |
| 2015/0354901 A1 * | 12/2015 | Moore ................ H01L 23/427 165/104.21 |
| 2016/0242320 A1 * | 8/2016 | Agostini ............ H05K 7/20927 |
| 2017/0069562 A1 | 3/2017 | Ide et al. |
| 2017/0202108 A1 | 7/2017 | Torresin et al. |
| 2018/0332739 A1 | 11/2018 | Takeuchi |
| 2019/0013119 A1 | 1/2019 | Tschida et al. |
| 2019/0067251 A1 | 2/2019 | Bando et al. |
| 2021/0259130 A1 * | 8/2021 | Jung .................... H05K 1/0213 |
| 2021/0366812 A1 * | 11/2021 | Matsushita ........... H01L 25/072 |

FOREIGN PATENT DOCUMENTS

| | | | |
|---|---|---|---|
| CN | 103477532 A | 12/2013 | |
| CN | 106954366 A | 7/2017 | |
| DE | 102011052284 A1 | 1/2013 | |
| EP | 0830811 B1 | 2/2000 | |
| EP | 1037515 A2 | 9/2000 | |
| EP | 2328172 A1 | 6/2011 | |
| EP | 2512023 A2 * | 10/2012 | ............ H02H 7/065 |
| EP | 2562808 A1 * | 2/2013 | ............ H01L 23/427 |
| EP | 3159908 A1 * | 4/2017 | ............ H01H 1/62 |
| JP | 2012069703 A | 4/2012 | |
| WO | 9732382 A1 | 9/1997 | |
| WO | 2018-222842 A1 | 12/2018 | |

\* cited by examiner

COOLING OF POWER SEMICONDUCTORS

BACKGROUND

The present inventions relate generally power semiconductors and cooling thereof.

Power semiconductors can dissipate significant amounts of heat which must be removed to keep the device at a reasonable operating temperature (i.e., 125° C.). Traditionally, this is accomplished with bulky heat sinks or liquid cooling. Some products have used Cothex two-phase thermosiphon based cooling to provide greater power density than heat sinks without the auxiliary pumps required for liquid cooling. Unfortunately, the geometry of power semiconductors (e.g., round shape for IGCTs) is not the same as the base-plate of these two phase cooling systems so that they must operate in a less effective hot-spot configuration. Heat spreaders are also often used in power-electronic cooling. Some examples of heat spreaders are thermal interface pads (e.g., graphite pads), copper or aluminum plates, copper plates with embedded heat pipes, and vapor chambers (like a two dimensional heat pipe). It is desirable to spread the heat across the entire area of the base-plate but this is not easy to accomplish without adding cost and complexity.

SUMMARY

Figure 1:
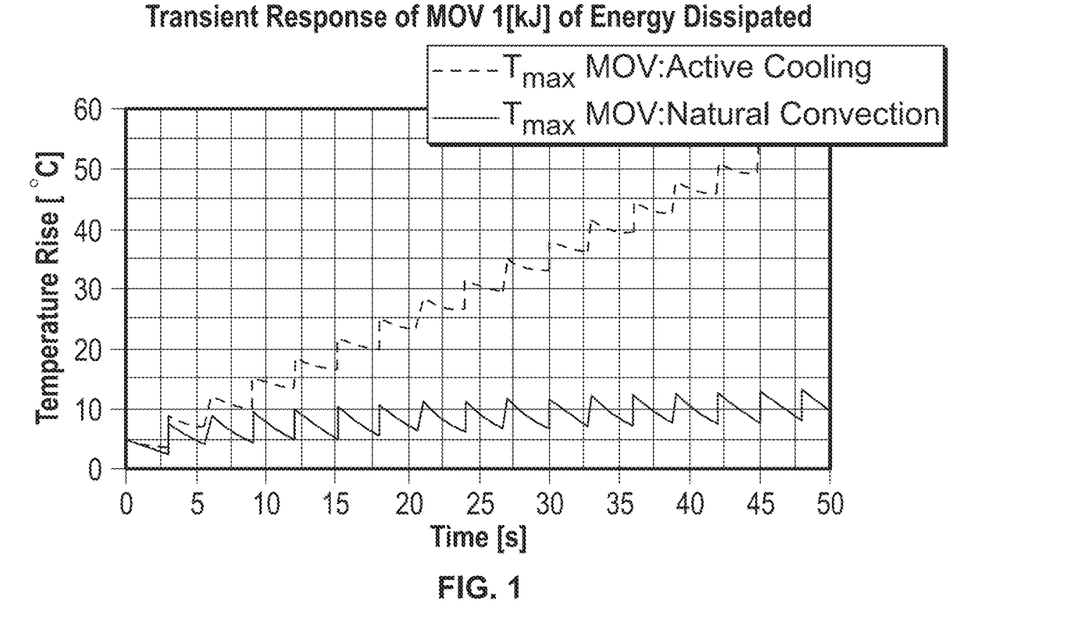
FIG. 1 is a chart showing active cooling and natural convection of a MOV during repetitive operation.

A new configuration is described for operating a solid-state circuit breaker in repetitive operation. This is particularly critical when the circuit breaker has the requirement of multiple reclosing actions after a fault. The state of the art involves natural convection cooling of the surge arrester. As shown in FIG. 1 (the top line in the chart), natural convection cooling allows a surge arrester to steadily rise in temperature in repetitive operation. It may take the surge arrester more than 30 minutes to cool down after use. As also shown in FIG. 1 (the bottom line in the chart), the described configuration allows repeated closing and openings with 3 second intervals without excessive oversizing of the surge arrester components. A metallic heat spreader (e.g., copper, aluminum, or a two-phase device) in between the power semiconductor and base-plate of the cooling element is also described. The bus bar and heat spreader may be combined into the same element so that the additional part count, cost, and complexity are minimized while at the same time enhancing the performance of the cooling system by decreasing the thermal resistance.

BRIEF DESCRIPTION OF SEVERAL VIEWS OF THE DRAWINGS

The invention may be more fully understood by reading the following description in conjunction with the drawings, in which.

DETAILED DESCRIPTION

Benefits of the arrangement described herein include:
1. Double sided cooling configuration for repetitive operation of a surge arrester in a solid state circuit breaker.
2. Enable repetitive operation and reclosing function for solid state circuit breakers.
3. Minimization of surge arrester requirements and volume.
4. Increased power density.

Figure 2:
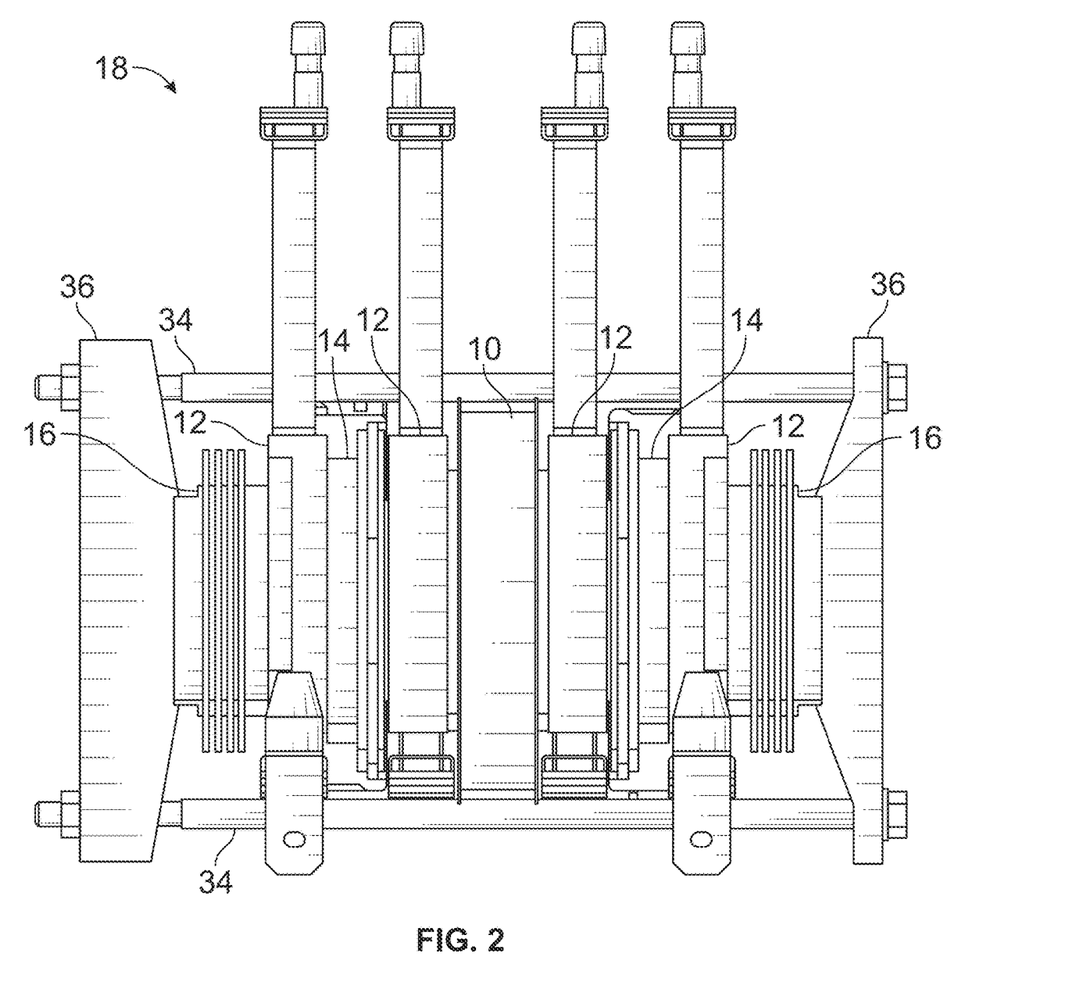
FIG. 2 is a front view of a double sided cooling configuration of a surge arrester for a solid state circuit breaker.

In the proposed configuration, the MOV 10 (metal-oxide varistor) is placed in the stack 18 which has the dual effect of cooling the MOV 10 and simplifying the bus-bar lay-out. An illustration of the proposed configuration is shown in FIG. 2. As shown, the MOV 10 is in the center of the circuit breaker 18, and active cooling systems 12 (e.g., PHPs) are on each side of the MOV 10. A power semiconductor 14 (e.g., IGCT) is on the other side of each PHP 12. The IGCTs 14 are against the PHPs 12 and the PHPs 12 are against the MOV 10 such that there are no active components therebetween. Some pulsating heat pipe (PHP) 12 configurations are "single sided" where the device is only designed to provide cooling from the face that is in contact with the IGCT 14. However, active cooling is still provided from the other face with a slightly increased thermal resistance. Insulators 16 are provided on the outer ends of the stack 18. It is understood that other types of power semiconductors may be used for the IGCT 14, including thyristors, A-IGCTs, RB-IGCTs, GTOs or others. Other types of coolers may also be used for the PHP 12, including two phase coolers, PHP, Cothex, hybrid Cothex, etc.

Figure 3:
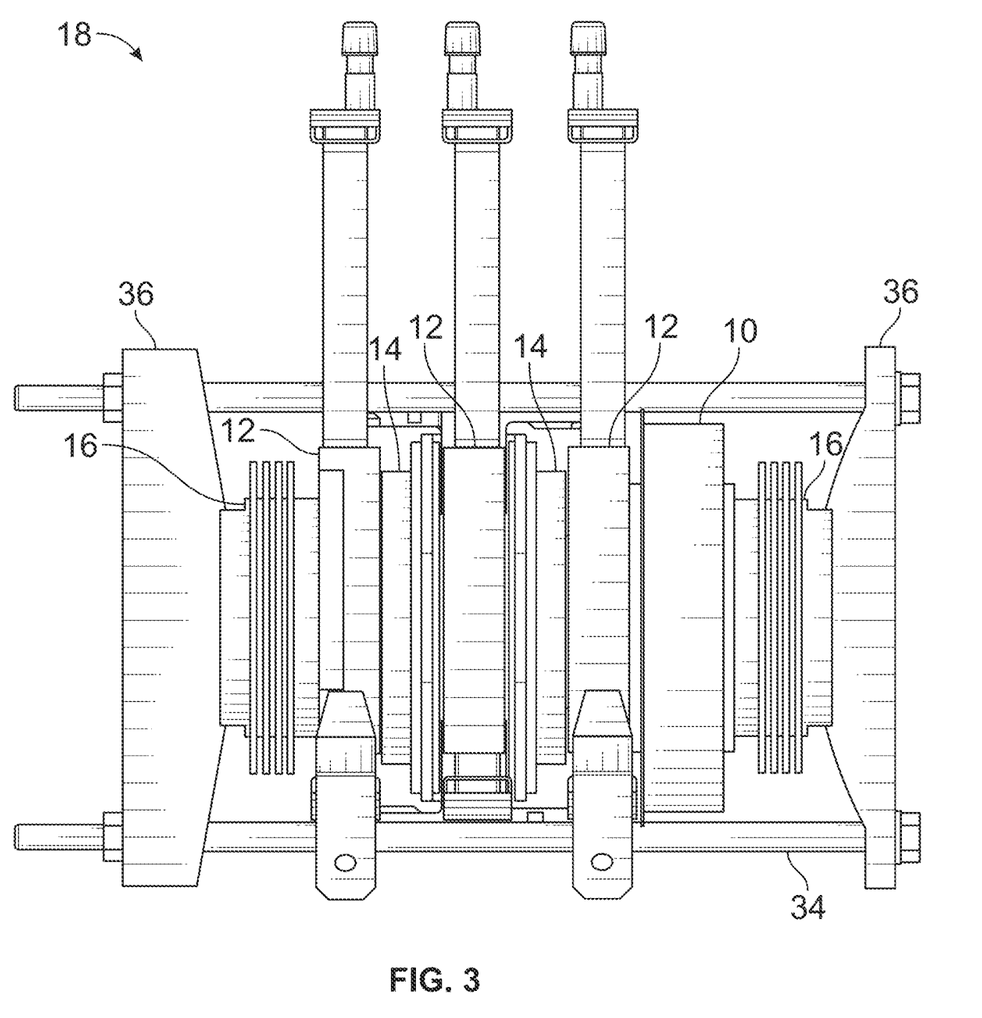
FIG. 3 is a front view of a single sided cooling configuration for the MOV.

As shown in FIG. 3, it is also possible to insert the MOV 10 in the stack 18 and only cool from one side. However, this reduces the cooling available for the MOV 10 and adds some additional complexity for bus-bar layout for the MOV 10.

Figure 4:
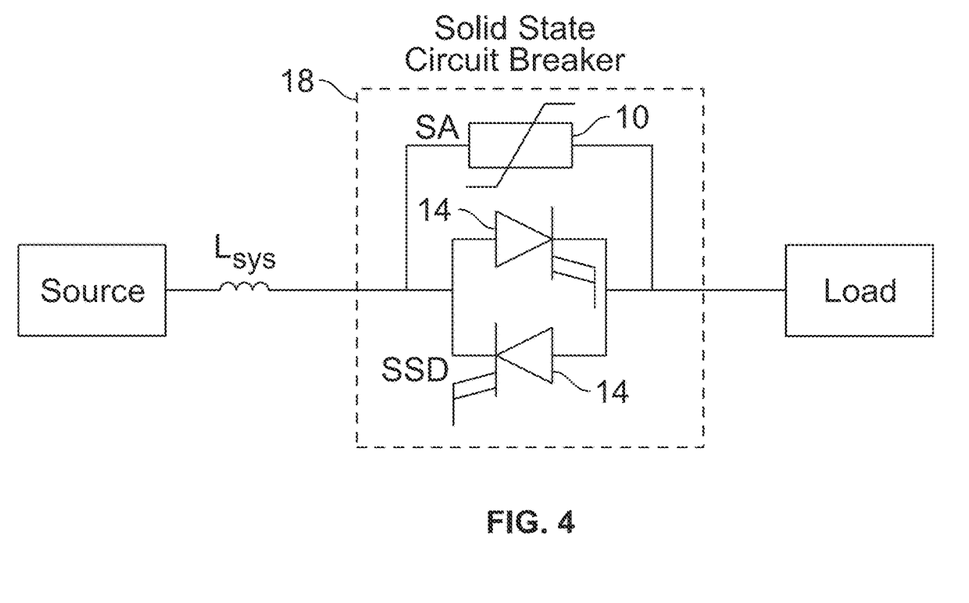
FIG. 4 is a schematic of a solid state circuit breaker.

A schematic of a solid state circuit breaker 18 is shown in FIG. 4.

The described configuration may be used in solid state circuit breakers that are characterized by ultra-fast opening speed, high number of operations, repetitive operation, reclosing function, and high power density.

The typical voltage range for the cooling arrangement is 50V to 2,000V and 100 A to 5,000 A. However, the cooling arrangement could also be used for higher voltages and current requirements.

The problems that the described cooling arrangement overcomes include:
1. High temperature and poor cooling of the surge arrester during repetitive operation of a solid state circuit breaker.
2. Oversizing of the surge arrester due to multiple power impulses during repetitive operation and reclosing action of the solid state circuit breaker.

Advantages of the described cooling arrangement include:
1. Enabling repetitive operation and reclosing function for solid state circuit breakers.
2. Minimization of surge arrester requirements and volume.

3. Increased power density.

Thus, the cooling arrangement enables the development of solid state circuit breakers that can perform repetitive operations and reclosing function with higher power density, smaller size, and higher current capability and lower cost.

Figure 5:
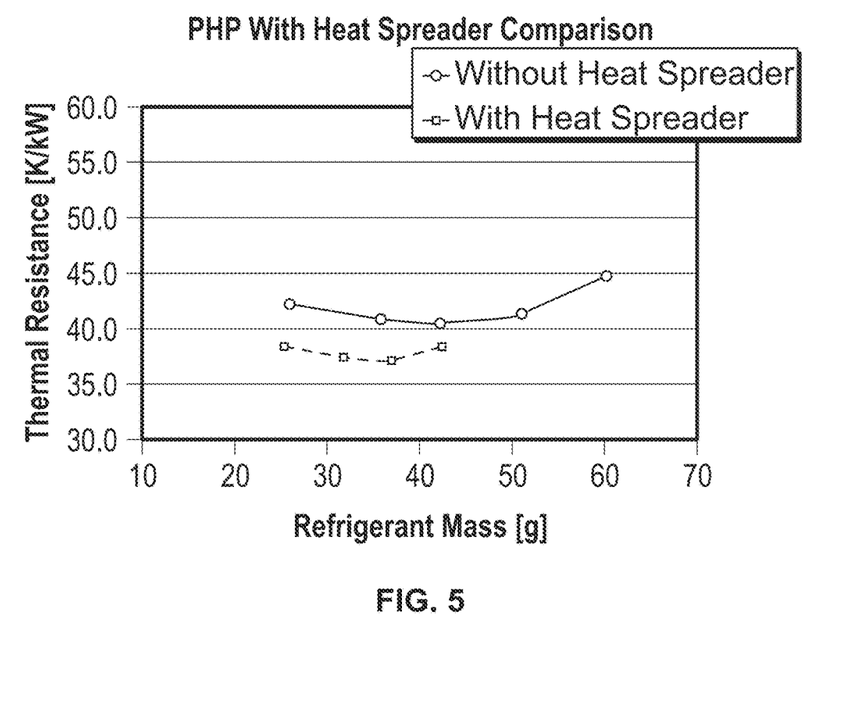
FIG. 5 is a chart showing the performance of a heat spreader relative to a PHP without a heat spreader.

FIG. 5 illustrates the performance of the described heat spreader (bottom line) relative to an unaided PHP (top line). The illustrated data is for dry contacts (no thermal paste) and R245fa as the working fluid. Note that the maximum difference is approximately 10%.

Figure 6A:
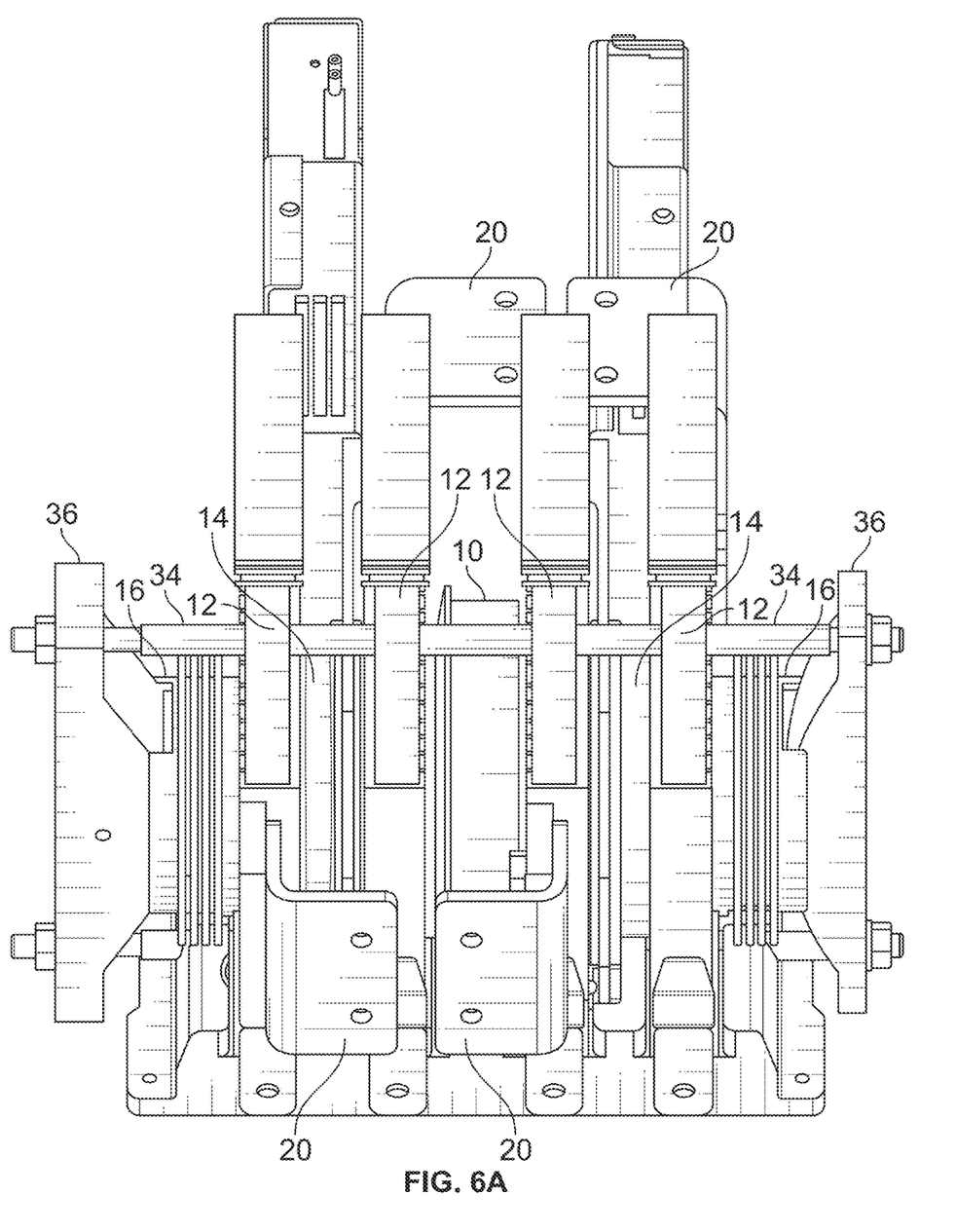
FIGS. 6A-6B are views of one configuration of a solid state circuit breaker.
Figure 6B:
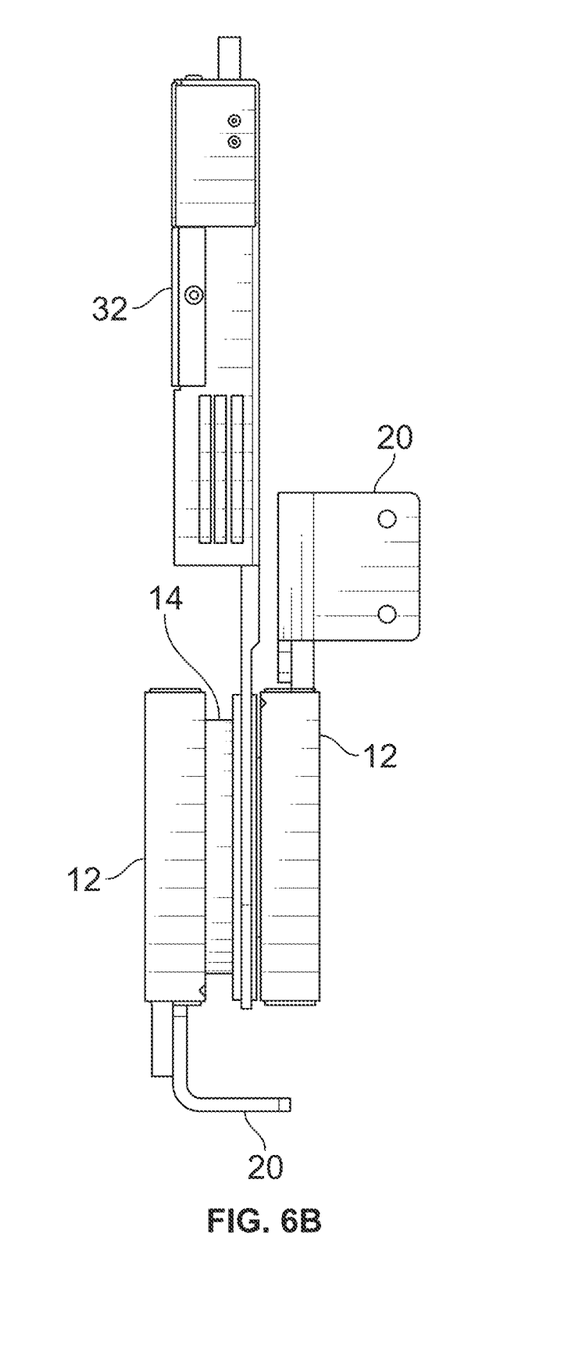
Figure 6C:
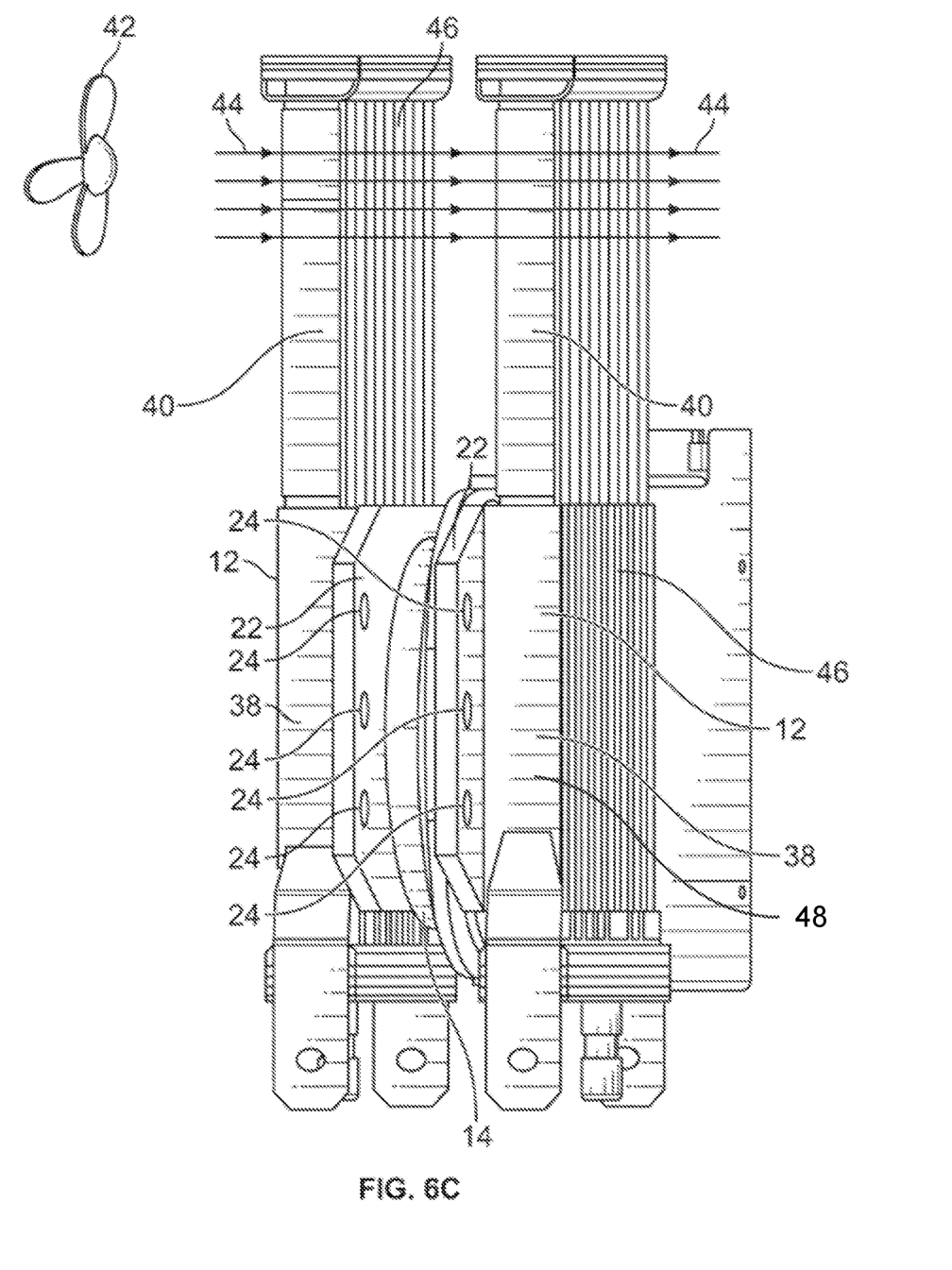
FIGS. 6C-6D are views of another configuration of a solid state circuit breaker.
Figure 6D:
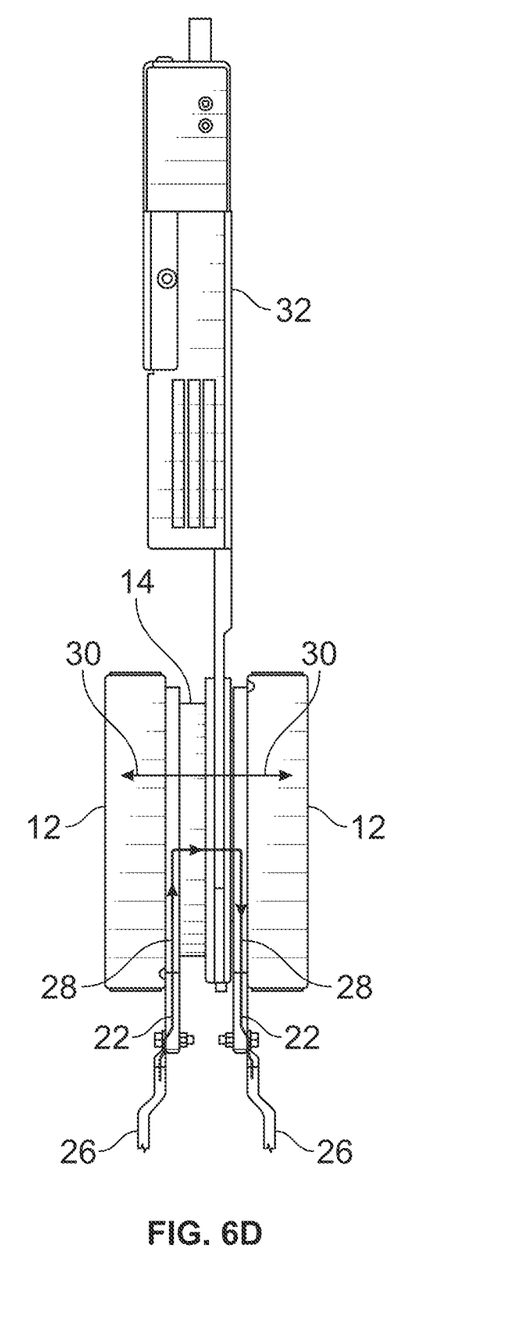

In FIGS. 6A-6D, pulsating heat pipe (PHP) cooling elements 12 are shown that may result in a 10% reduction in thermal resistance with a copper plate. It may be possible to achieve further reductions with optimization of the plate thickness and thermal interface. One configuration of a DC solid state circuit breaker 18 with PHPs 12 is shown in FIG. 6A-6B, showing the bus bar 20 layout. A single IGCT 14 of FIG. 6A is shown in FIG. 6B. FIGS. 6C-6D show an improved heat-spreader bus bar 22 that may achieve a 10% reduction in thermal resistance with a copper plate. In the embodiment of FIGS. 6C-6D, the bus bar 22 is sandwiched between the pulsating heat pipe 12 and the IGCT 14 to conduct heat from the IGCT 14 to the pulsating heat pipe 12 across the thickness of the bus bar 22. Preferably, the bus bar 22 is metallic and may be made of copper or aluminum. The bus bar 22 is an integral component that forms a heat spreading plate between the pulsating heat pipe 12 and the IGCT 14 and extends at least partly beyond the outer circumference of the pulsating heat pipe 12 and the IGCT 14 to provide exposed connectors 24.

Figure 7A:
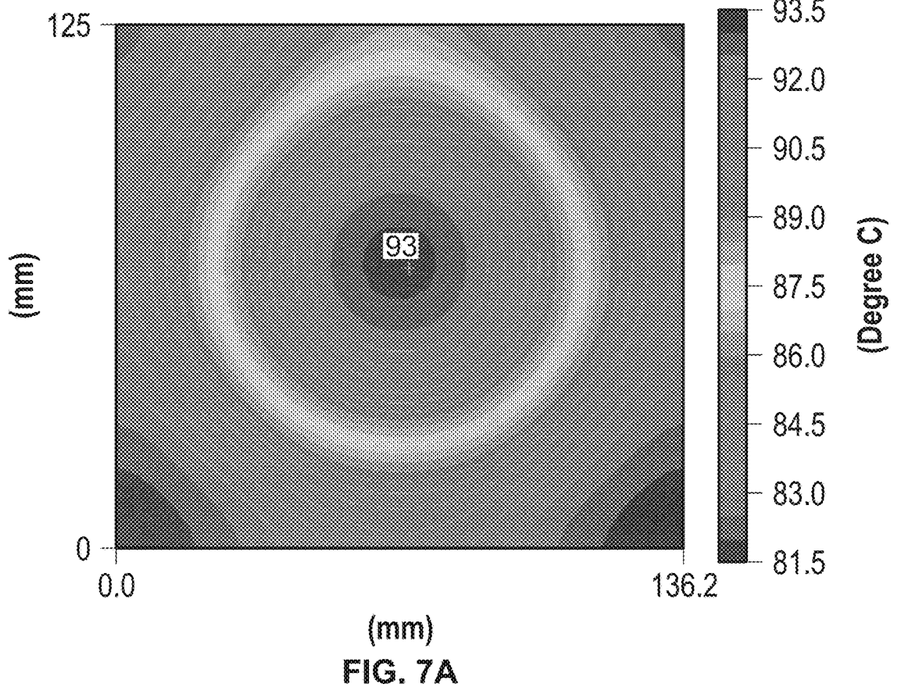
FIGS. 7A-7B are temperature simulations with a heat spreader and without a heat spreader.
Figure 7B:
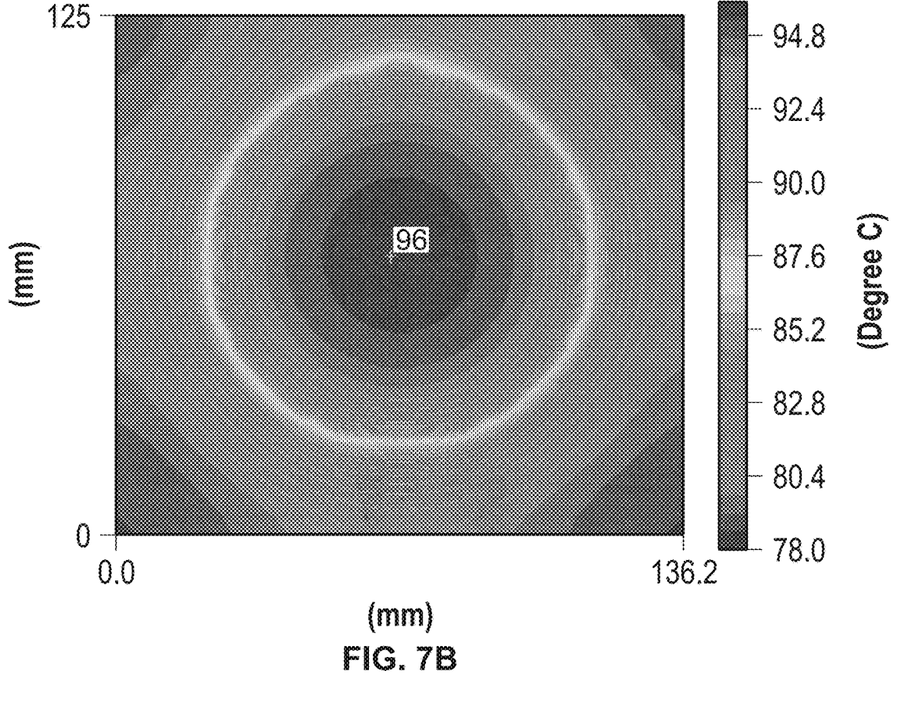

Based on simulations (FIGS. 7A-7B), the copper plate homogenizes the temperature distribution on the base plate but does not greatly reduce the junction temperature. FIG. 7A shows the case temperature of an IGCT with a 6.3 mm copper heat spreader mounted to a Cothex cooling element with a temperature variation of 6K across the disk, and FIG. 7B shows the case temperature of the same device without the copper spreader showing a 9K variation. The result is a similar device rating but with less imposed thermal stress and therefore better reliability. In one case, a maximum temperature difference of 26 K was measured on the surface of an IGCT device cooled with PHPs at 2 kA current (~2 kW heat losses). The same PHP device was also tested with a copper heater having the same contact area of the IGCT and a maximum temperature difference of 17 K was measured at the same boundary conditions. Since a copper heater represents an "ideal" IGCT device with the best spreading possible to achieve (in the IGCT packaging there is also molybdenum as material), these results showed that there is room for improving the IGCT temperature distribution.

If the thermal conductivity of the base plate is further improved (e.g., with a vapor chamber) then the junction temperature can be reduced by 6K for the same thermal load while the temperature distribution is homogenized.

Advantages of the described arrangement include:

1. The base-plate temperature is homogenized to reduce thermal stress on the semiconductor and results in better reliability.

2. Better utilization of the base plate of the cooling element due to better heat spreading.

3. A low cost solution (copper or aluminum plate).

4. If an aluminum plate is used, it can be brazed during the cooler manufacturing process (also a copper nickel-plated plate can be brazed).

5. Additional electrical resistance is not added due to contacts.

6. In the case of stacking several power semiconductor devices in series, better utilization is possible of outer cooling elements of the stacks which receive heat only from one side.

7. The use of thermal paste or other thermal contact mediums is possible at the added interface since this interface will not be conducting electricity.

8. Higher electrical conductivity of bus bar/heat spreader will slightly reduce local losses in either AC or DC operation.

The preferred arrangement may include a heat spreader (made for instance by a nickel plated copper) for power semiconductor stacks which is also a bus bar. The arrangement by virtue of its mechanical layout also may only conduct electricity through one interface and heat through two, reducing electrical losses due to additional contact resistance. The arrangement may also be produced from a same (Aluminum) or higher (Copper) electrical conductivity material than the cold plate element, minimizing AC/DC electrical losses in that element.

The described arrangement could be modified to improve performance by using aluminum copper clad as material for the cooling unit baseplate, adding heat pipes to the heat spreader/bus bar, incorporating a vapor chamber into the bus bar, or manufacturing the heat spreader out of a layer of materials which have different material properties, higher electrical conductivity or thermal conductivity.

As shown in FIGS. 6C-6D, the bus bar 22 is sandwiched between an active cooling system 12 and a power semiconductor 14. Since the bus bar 20 is metallic, heat generated by the power semiconductor 14 is conducted 30 away from the power semiconductor 14 to the active cooling system 12 through the thickness of the bus bar 22. A portion of the bus bar 22 also extends beyond an outer edge of the active cooling system 12 and the power semiconductor 14 to provide an exposed electrical connector 24. The bus bar 22 may be a copper plate 22 between the active cooling system 12 and the power semiconductor 14. As shown in FIG. 6C, the exposed electrical connector 24 may be a hole 24 through the bus bar 22.

As shown in FIG. 6D, separate bus bars 22 are preferably pressed against each side of the power semiconductor 14 (i.e., opposite sides). An electrical conductor 26 may also be connected to the electrical connector 24 of each bus bar 22. In use, different voltage potentials are applied to each of the electrical conductors 26 (e.g., a positive potential and ground). As a result, current 28 flows from one conductor 26, through the attached bus bar 22, through the corresponding side of the power semiconductor 14, the power semiconductor 14, out the other side of the power semiconductor 14, through the other bus bar 22, and to the other electrical conductor 26. As understood, current flow 28 through the power semiconductor 14 is controlled by a gate driver 32 which may extend outward from the power semiconductor 14. Thus, the gate driver 32 turns the power semiconductor 14 on and off to allow current flow 28 therethrough and to block current flow 28. Unlike other arrangements where the electrical connector 24 may be attached to the active cooling system 12 (e.g., FIG. 6B), the current 28 does not flow through the active cooling system 12. Even so, it is likely that the voltage potential applied by the conductors 26 will also be incidentally applied to the active cooling systems 12 where the contact between the bus bar 22 and the active cooling system 12 is not insulated due to the desire to transfer heat through the bus bar 22 to the active cooling system 12.

As shown in FIGS. 2 and 6A, the circuit breaker 18 may have a surge arrester 10 in the center between two power semiconductors 14 (see for reference FIG. 4). In this arrangement, an active cooling system 12 may be located between each of the power semiconductors 14 and opposite sides of the surge arrester 10. Each of the power semiconductors 14 may have an active cooling system 12 on opposite sides thereof with a bus bar 22 between each active cooling system 12 and each side of the power semiconductors 14 as described above. The circuit breaker 18 may also include clamps 34 and clamping members 36 at opposite ends of the circuit breaker 18 to press the surge arrester 10, active cooling systems 12, power semiconductors 14 and insulators 16 together in a stack.

As shown in FIG. 6C, each of the active cooling systems 12 may have an evaporator section 38 and a condenser section 40. The evaporator section 38 is pressed against the bus bar 22 to receive heat therefrom. The condenser section 40 extends beyond the outer edge of the bus bar 22 and power semiconductor 14 to dissipate the heat. Preferably, a fan 42 may be provided to blow air 44 through the condenser section 40 to transfer heat into the air 44.

Figure 8:
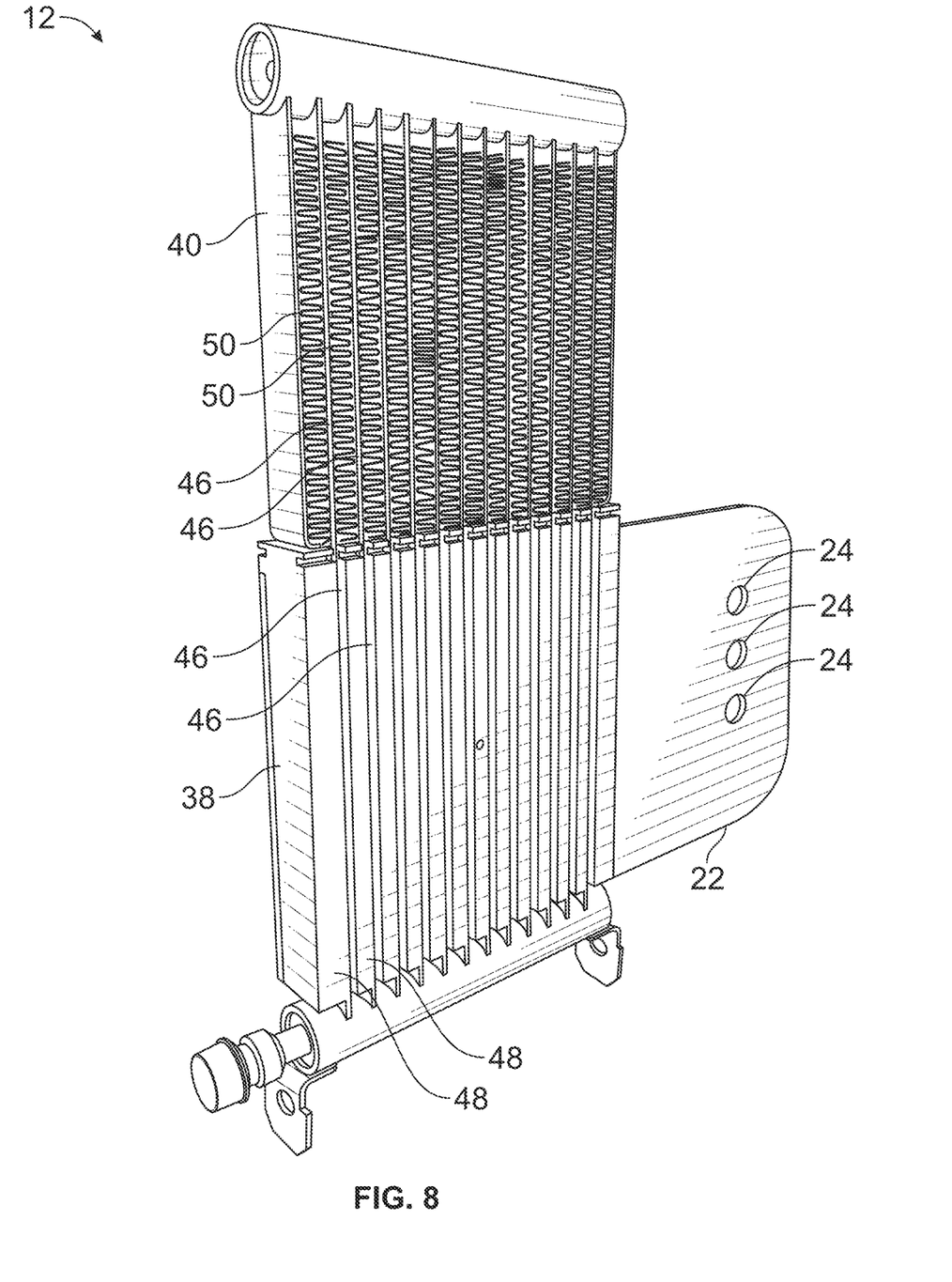
FIG. 8 is a perspective view of one side of an active cooling system.
Figure 9:
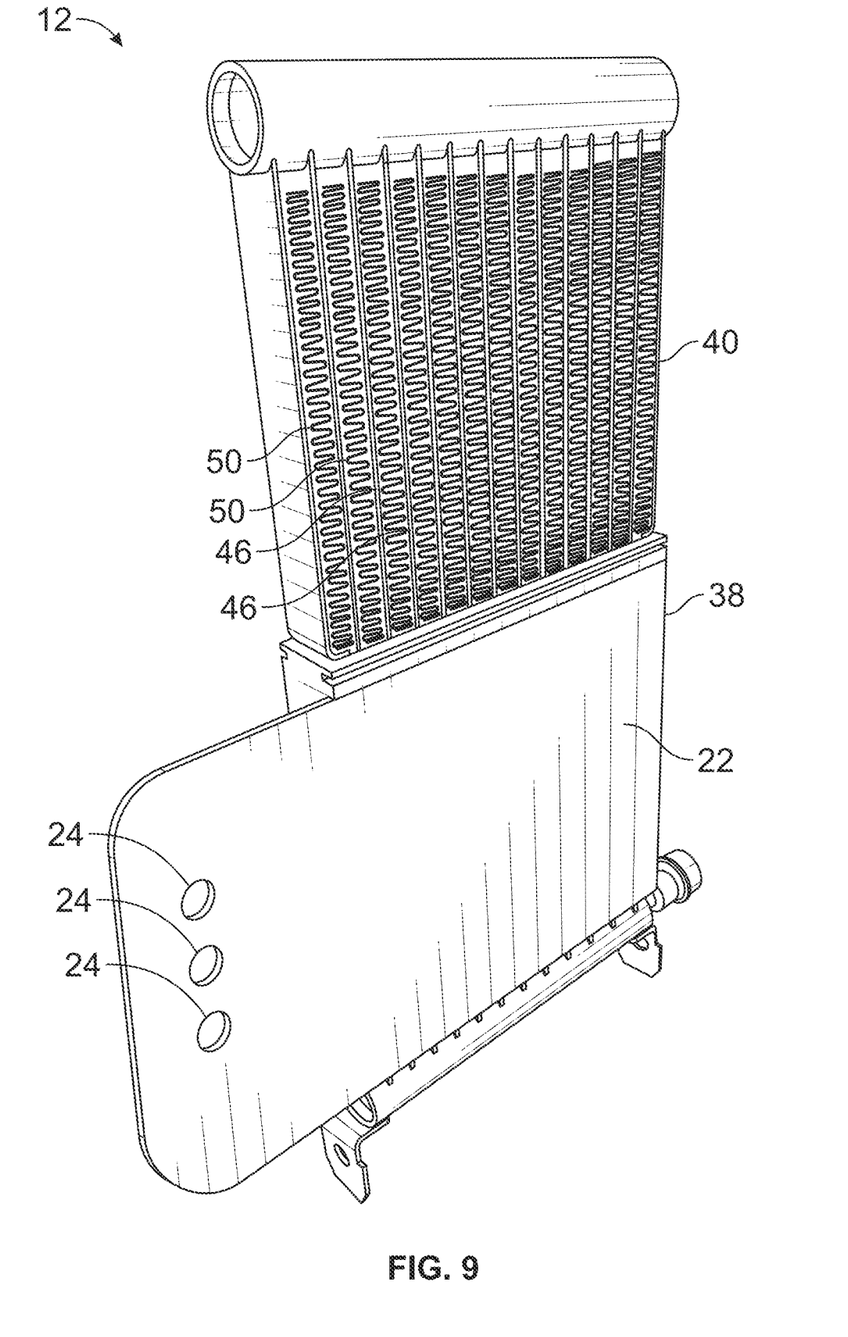
FIG. 9 is a perspective view of the other side of the active cooling system, showing a bus bar pressed thereagainst.

As shown in FIGS. 6C and 8-9, the active cooling system 12 may include a plurality of pipes 46 that are filled with a working fluid. The pipes 46 extend through the evaporator section 38 and the condenser section 40. As shown in FIG. 8, metallic heat sinks 48 may be provided between the pipes 46 to convey heat into the evaporator section 38. Fins 50 may also be provided between the pipes 46 in the condenser section 40 to convey heat to the air 44 passing between the pipes 46. Preferably, the metallic heat sinks 48 in the evaporator section 38 are made of aluminum. As shown in FIG. 9, the bus bar 22 may be pressed against the metallic heat sinks 48 to transfer heat from the bus bar 22 to the evaporator section 38. Although a dry fit or thermal paste may be used between the bus bar 22 and the evaporator section 38, it may be preferable for the bus bar 22 to be brazed to the metallic heatsinks 48. For example, a metallic brazing material may be deposited onto the metallic heat sinks 48 and/or the bus bar 22 and the bus bar 22 may be pressed against the metallic heat sinks 48 with the brazing material therebetween. The active cooling system 12 and the bus bar 22 made then be placed in an oven to melt the brazing material to braze the bus bar 22 to the metallic heat sinks 48.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A solid state circuit breaker, comprising:
a first power semiconductor;
a gate driver,
wherein the gate driver is in electronic communication with the first power semiconductor, the gate driver extending from the first power semiconductor in a first direction,
a first active cooling system,
wherein the first active cooling system extends in a second direction perpendicular to the first direction;
a fan; and
a first bus bar disposed between the first active cooling system and the first power semiconductor, the first bus bar being sandwiched between a base plate of the first active cooling system and the first power semiconductor to conduct heat from the first power semiconductor to the first active cooling system through a thickness of the first bus bar, the first bus bar being metallic and extending at least a portion beyond the first active cooling system and the first power semiconductor in a third direction opposite the first direction and perpendicular to the second direction to provide a first exposed electrical connector;
wherein the first active cooling system comprises an evaporator section pressed against the first bus bar and a condenser section extending beyond the first bus bar and the first power semiconductor in the second direction; and
wherein the fan is located adjacent the condenser section to direct air through the condenser section;
wherein the first bus bar comprises a copper plate to homogenize a temperature distribution on the base plate without substantially reducing a junction temperature to reduce thermal stress on the first power semiconductor.

2. The solid state circuit breaker according to claim 1, wherein the first active cooling system comprises a plurality of pipes filled with a working fluid extending through the evaporator and condenser sections, the evaporator section comprising metallic heat sinks extending between the pipes, the first bus bar being pressed against the metallic heat sinks.

3. The solid state circuit breaker according to claim 2, wherein the first bus bar is brazed to the metallic heat sinks.

4. The solid state circuit breaker according to claim 3, wherein the metallic heat sinks comprise aluminum.

5. The solid state circuit breaker according to claim 1, wherein the first exposed electrical connector being formed in a portion of the copper plate.

6. The solid state circuit breaker according to claim 1, wherein the first exposed electrical connector comprises a hole extending through the first bus bar.

7. The solid state circuit breaker according to claim 1, further comprising a first electrical conductor connected to the first exposed electrical connector, the first electrical conductor applying a first voltage potential to the first bus bar, and the first bus bar applying the first voltage potential to a first side of the first power semiconductor.

8. The solid state circuit breaker according to claim 7, wherein the first voltage potential is also applied to the first active cooling system by the first bus bar.

9. The solid state circuit breaker according to claim 7, further comprising a second active cooling system and a second bus bar,
wherein the first bus bar is disposed against the first side of the first power semiconductor and the second bus bar is disposed against a second side of the first power semiconductor opposite from the first side,
the second bus bar being disposed between the second active cooling system and the first power semiconductor, the second bus bar being sandwiched between the second active cooling system and the first power semiconductor to conduct heat from the first power semiconductor to the second active cooling system through a thickness of the second bus bar, the second bus bar being metallic and extending at least a portion beyond the second active cooling system and the first power semiconductor to provide a second exposed electrical connector, a second electrical conductor connected to the second exposed electrical connector, the second electrical conductor applying a second voltage potential to the second bus bar, and the second bus bar applying the second voltage potential to the second side of the first power semiconductor, and electrical current thereby flowing from the first electrical conductor through the first bus bar, the first side of the first power semiconductor, the first power semiconductor, the second side of the first power semiconductor and the second bus bar to the second electrical conductor.

10. The solid state circuit breaker according to claim 1, wherein the first active cooling system is a pulsating heat pipe, Cothex or hybrid Cothex.

11. The solid state circuit breaker according to claim 1, wherein the first power semiconductor comprises an IGCT, thyristor, A-IGCT, RB-IGCT or GTO.

12. The solid state circuit breaker according to claim 1, further comprising: a surge arrester disposed within a center of the solid state circuit breaker;

the first active cooling system disposed against one side of the surge arrester and a second active cooling system disposed against an opposite side of the surge arrester; and the first power semiconductor disposed against the first active cooling system on an opposite side from the surge arrester, and a second power semiconductor disposed against the second active cooling system on an opposite side from the surge arrester.

13. The solid state circuit breaker according to claim 1, further comprising:

a first electrical conductor connected to the first exposed electrical connector, the first electrical conductor applying a first voltage potential to the first bus bar and the first bus bar applying the first voltage potential to a first side of the first power semiconductor.

14. The solid state circuit breaker according to claim 13, wherein the first active cooling system comprises a plurality of pipes filled with a working fluid extending through the evaporator and condenser sections, the evaporator section comprising metallic heat sinks extending between the pipes, the first bus bar being pressed against the metallic heat sinks.

15. The solid state circuit breaker according to claim 14, wherein the first exposed electrical connector comprises a hole extending through the first bus bar, and the first voltage potential is also applied to the first active cooling system by the first bus bar.

16. The solid state circuit breaker according to claim 15, further comprising a second active cooling system and a second bus bar, wherein the first bus bar is disposed against the first side of the first power semiconductor and the second bus bar is disposed against a second side of the first power semiconductor opposite from the first side, the second bus bar being disposed between the second active cooling system and the first power semiconductor, the second bus bar being sandwiched between the second active cooling system and the first power semiconductor to conduct heat from the first power semiconductor to the second active cooling system through a thickness of the second bus bar, the second bus bar being metallic and extending at least a portion beyond the second active cooling system and the first power semiconductor to provide a second exposed electrical connector, a second electrical conductor connected to the second exposed electrical connector, the second electrical conductor applying a second voltage potential to the second bus bar, and the second bus bar applying the second voltage potential to the second side of the first power semiconductor, and electrical current thereby flowing from the first electrical conductor through the first bus bar, the first side of the first power semiconductor, the first power semiconductor, the second side of the first power semiconductor and the second bus bar to the second electrical conductor.

17. The solid state circuit breaker according to claim 16, further comprising:

a surge arrester disposed within a center of the solid state circuit breaker;

the first active cooling system disposed against one side of the surge arrester and a third active cooling system disposed against an opposite side of the surge arrester; and the first power semiconductor disposed against the first active cooling system on an opposite side from the surge arrester, and a second power semiconductor disposed against the third active cooling system on an opposite side from the surge arrester.

* * * * *